United States Patent
Noda (10) Patent No.: US 8,330,487 B2
(45) Date of Patent: Dec. 11, 2012

(54) SEMICONDUCTOR DEVICE (75) Inventor: Hiromasa Noda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/585,233

(22) Filed: Sep. 9, 2009

(65) Prior Publication Data

US 2010/0066406 A1   Mar. 18, 2010

(30) Foreign Application Priority Data

Sep. 12, 2008  (JP) ................ P2008-234863

(51) Int. Cl.
*H03K 19/23* (2006.01)
*G01R 31/26* (2006.01)

(52) U.S. Cl. ............ 326/33; 326/93; 326/95; 326/34; 327/541; 327/544; 324/765

(58) Field of Classification Search ............ 326/33–34, 326/83, 93, 95, 98, 121, 16; 327/309, 530, 327/541, 544, 546; 324/522, 525, 763, 765
See application file for complete search history.

(56) References Cited

U.S. PATENT DOCUMENTS

| | | | |
|---|---|---|---|
| 6,292,015 B1 | 9/2001 | Ooishi et al. | |
| 6,483,165 B2 * | 11/2002 | Ooishi et al. | 257/499 |
| 6,765,429 B2 * | 7/2004 | Miyagi | 327/534 |
| 6,836,179 B2 * | 12/2004 | Mizuno et al. | 327/544 |
| 6,864,708 B2 * | 3/2005 | Takahashi et al. | 326/33 |
| 7,042,245 B2 * | 5/2006 | Hidaka | 326/34 |
| 7,219,244 B2 * | 5/2007 | Kuang et al. | 713/320 |
| 7,276,932 B2 * | 10/2007 | Kuang et al. | 326/33 |
| 7,598,802 B2 * | 10/2009 | Ito | 327/581 |
| 2002/0000873 A1 | 1/2002 | Tanizaki et al. | |

FOREIGN PATENT DOCUMENTS

| | | |
|---|---|---|
| JP | 2000-30443 | 1/2000 |
| JP | 2000-48568 | 2/2000 |
| JP | 2000-195254 | 7/2000 |

* cited by examiner

*Primary Examiner* — Vibol Tan
(74) *Attorney, Agent, or Firm* — McGinn IP Law Group, PLLC (57) ABSTRACT

The semiconductor device may include, but is not limited to, a first switching circuit, a second switching circuit, and a control circuit. The first switching circuit switches between first and second states. The second switching circuit switches between the first and second states. The second switching circuit reduces a first power impedance across the first switching circuit. The control circuit is coupled to the first and second switching circuits. The control circuit keeps the first switching circuit in the first state. The control circuit switches the second switching circuit from the second state to the first state.

39 Claims, 3 Drawing Sheets

SEMICONDUCTOR DEVICE

BACKGROUND OF THE INVENTION

1. Field of the Invention

The present invention generally relates to a semiconductor device. More specifically, the present invention relates to a semiconductor device including a Subthreshold Current Reduction Circuit that reduces a leakage of a transistor.

Priority is claimed on Japanese Patent Application No. 2008-234863, filed Sep. 12, 2008, the content of which is incorporated herein by reference.

2. Description of the Related Art

In recent years, there has been on the increase the requirement for small power voltage, high speed performance, and small power consumption of a semiconductor device such as a Dynamic Random Access Memory, hereinafter referred to as a DRAM. When the power voltage is lowered, it is necessary for ensuring the On-current of a transistor that the threshold voltage of the transistor be decreased in accordance with the scaling rule. The decrease of the threshold voltage of the transistor increases the Off-current and the current leakage.

Various circuits to reduce the current leakage have been proposed, for example, in Japanese Unexamined Patent Application, First Publications, Nos. 2000-195254, 2000-030443, and 2000-048568. One of the proposed circuits is a subthreshold current reduction circuit, hereinafter referred to as an SCRC. In the SCRC, two kinds of power lines such as a main power line and a sub power line are disposed. The main power line and the sub power line are connected to each other through metal oxide semiconductor transistors that each works as a switch. The metal oxide semiconductor transistor will hereinafter be referred to as a switching MOS transistor. When a memory bank is in an idle state that is a standby state, the switching MOS transistor turns into OFF to reduce the current leakage into the sub power line.

SUMMARY

In one embodiment, a semiconductor device may include, but is not limited to, a first switching circuit, a second switching circuit, and a control circuit. The first switching circuit switches between first and second states. The second switching circuit switches between the first and second states. The second switching circuit reduces a first power impedance across the first switching circuit. The control circuit is coupled to the first and second switching circuits. The control circuit keeps the first switching circuit in the first state. The control circuit switches the second switching circuit from the second state to the first state.

In still another embodiment, a semiconductor device may include, but is not limited to, a main power line that supplies a first voltage, a sub power line that supplies a second voltage different from the first voltage, and a logic circuit coupled to the sub power line, first and second switching circuits and a control circuit. The first switching circuit is coupled between the main power line and the sub power line. The first switching circuit switches between first and second states to switch the first and second voltages to be supplied to the logic circuit. The second switching circuit is coupled between the main power line and the sub power line, the second switching circuit switching between the first and second states. The second switching circuit reduces a power impedance between the main power line and the sub power line. The control circuit is coupled to the first and second switching circuits. The control circuit keeps the first switching circuit in the first state. The control circuit switches the second switching circuit from the second state to the first state.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be briefly explained in order to facilitate the understanding of the present invention.

Recently, it has become difficult to suppress variations of a device as the device has become scaled down. The leakage of the transistor having a high threshold voltage in the OFF-state might be lower than the specified current value, hereinafter referred to as an SPEC current value, even if no countermeasures such as SCRC are adopted to suppress the current leakage. In many cases, the device includes an SCRC control circuit that reduces the subthreshold current assuming that the threshold of the transistor is lower than the designed value.

Once the semiconductor device including the SCRC circuit is designed, it is permitted that the switching MOS transistor is always kept in ON-state due to no need of performance of the SCRC circuit that is integrated in the semiconductor device. The switching MOS transistor is always kept to have the ON-resistance as long as the switching MOS transistor is always kept in ON-state. As a result, the semiconductor device including the SCRC circuit is higher in power impedance than the semiconductor device free of the SCRC circuit.

In order to reduce the ON-resistance, it is effective to increase the gate width of the switching MOS transistor. The increased gate width of the switching MOS transistor needs a large scale driver circuit that controls ON-OFF switching operations of the switching MOS transistor. Also the increased gate width of the switching MOS transistor increases the time necessary to switch the OFF-state to the ON-state of the switching MOS transistor, resulting in the increased power consumption.

It is preferable to decrease the power impedance when the switching transistor is kept in the ON-state, wherein the switching transistor which is designed to control the current leakage does not need to be used to control the current leakage, and wherein the gate width of the switching transistor is not widened.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

Figure 1:
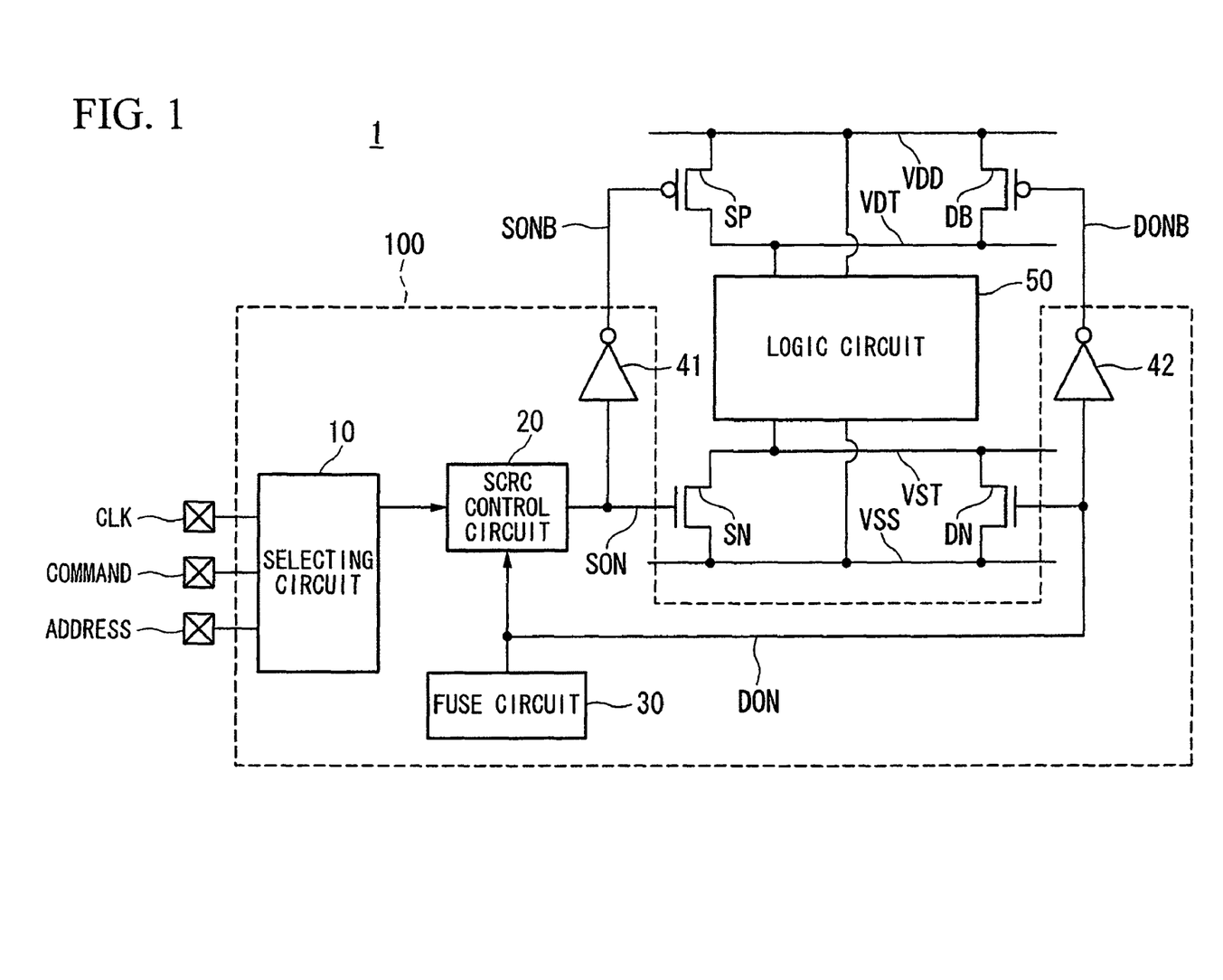
FIG. 1 is a schematic diagram illustrating a semiconductor device in accordance with a first preferred embodiment of the present invention.

FIG. 1 is a schematic diagram illustrating a semiconductor device 1 in accordance with a first preferred embodiment of the present invention. The semiconductor device 1 may use the SCRC to reduce the current leakage. The semiconductor device 1 may include, but is not limited to, a logic circuit 50, a first pair of a main power line VDD and a sub power line VDT, a second pair of a main power line VSS and a sub power line VST, a first pair of switching circuits SP and DB and a second pair of switching circuits SN and DN, and an control circuit 100. The logic circuit 50 may be coupled to the sub power line VDT and also to the sub power line VST. The first pair of switching circuits SP and DB may be coupled between the first-paired main and sub power lines VDD and VDT. The second pair of switching circuits SN and DN may be coupled between the second-paired main and sub power lines VSS and VST. The first-paired main and sub power lines VDD and VDT may provide first and second voltages that are different from each other. The second-paired main and sub power lines VSS and VST may provide third and fourth voltages that are different from each other. The third and fourth voltages may be different from the first and second voltages.

The switching circuit SP may act as a first type switching circuit that selectively provides one of the first and second voltages to the logic circuit. Typically, the switching circuit SP may be provided between the first-paired main and sub power lines VDD and VDT, so that the switching circuit SP switches between first and second states so as to switch the first and second voltages to be supplied to the logic circuit. The first and second states may, for example, be ON-state and OFF-state.

The switching circuit SN may act as the first type switching circuit that selectively provides one of the third and fourth voltages to the logic circuit. Typically, the switching circuit SN may be provided between the second-paired main and sub power lines VSS and VST, so that the switching circuit SN switches between the first and second states so as to switch the third and fourth voltages to be supplied to the logic circuit. The first and second states may, for example, be ON-state and OFF-state.

The control circuit 100 may be coupled to the first-paired switching circuits SP and DB. Typically, the first-paired switching circuits SP and DB may be coupled in parallel to the control circuit 100. The control circuit 100 may control switching operations of the first-paired switching circuits SP and DB. The control circuit 100 may be configured to keep the switching circuit SP as the first type switching circuit in the first state, for example, ON-state, and to switch the switching circuit DB as the second type switching circuit from the second state, for example, OFF-state to the first state, for example, the ON-state. The conditions for causing the control circuit 100 to control the first-paired switching circuits SP and DB may be given optionally in consideration of the application of the semiconductor device to a particular device such as a semiconductor memory.

The control circuit 100 may also be coupled to the second-paired switching circuits SN and DN. Typically, the second-paired switching circuits SN and DN may be coupled in parallel to the control circuit 100. The control circuit 100 may also control switching operations of the second-paired switching circuits SN and DN. The control circuit 100 may also be configured to keep the switching circuit SN as the first type switching circuit in the first state, for example, ON-state, and to switch the switching circuit DN as the second type switching circuit from the second state, for example, OFF-state to the first state, for example, the ON-state. The conditions for causing the control circuit 100 to control the second-paired switching circuits SN and DN may be the same as or different from the conditions for causing the control circuit 100 to control the first-paired switching circuits SP and DB.

In some cases, the control circuit 100 may be connected through a line SONB to the switching circuit SP as the first type switching circuit. The control circuit 100 may be connected through a line SON to the switching circuit SN as the second type switching circuit. The control circuit 100 may be connected through a line DONB to the switching circuit DB as the first type switching circuit. The control circuit 100 may be connected through a line DON to the switching circuit DN as the second type switching circuit.

The switching circuits SP and DB may include, but are not limited to, P-channel MOS transistors, hereinafter referred to as PMOS transistors. The switching circuit SP may be coupled between the main power line VDD and the sub power line VDT. The switching circuit DB may be coupled between the main power line VDD and the sub power line VDT. The switching circuit SP and the switching circuit DB may be coupled in parallel to the control circuit 100. The switching circuits SN and DN may include, but are not limited to, N-channel MOS transistors, hereinafter referred to as NMOS transistors. The switching circuit SN may be coupled between the main power line VSS and the sub power line VST. The switching circuit DN may be coupled between the main power line VSS and the sub power line VST. The switching circuit SN and the switching circuit DN may be coupled in parallel to the control circuit 100.

In some cases, the semiconductor device 1 may be applied to semiconductor memories such as DRAMs that may include memory banks which are not illustrated. In this case, the logic circuit 50 can also be used as a sense amplifier circuit that can be used to amplify data that have been read of memory cells in the memory bank.

In some cases, the control circuit 100 may include, but is not limited to, a fuse circuit 30 that may be configured to be cut to keep the switching circuit SP as the first type switching circuit in the first state, for example, ON-state and to switch the switching circuit DB as the second type switching circuit from the second state, for example, OFF-state to the first state, for example, ON-state. The fuse circuit 30 may also be configured to be cut to keep the switching circuit SN as the first type switching circuit in the first state, for example, ON-state and to switch the switching circuit DN as the second type switching circuit from the second state, for example, OFF-state to the first state, for example, ON-state. The conditions for causing the fuse circuit 30 to be cut may be given optionally in consideration of the application of the semiconductor device to a particular device such as a semiconductor memory.

In other cases, the control circuit 100 may include, but is not limited to, a fuse circuit 30 and a subthreshold current reduction control circuit 20. The fuse circuit 30 may be coupled through the subthreshold current reduction control circuit 20 to the switching circuits SP and SN as the first type switching circuits. The fuse circuit 30 may be coupled to the switching circuits DB and DN as the second type switching circuits. The fuse circuit 30 may be configured to be cut to switch the switching circuit DB as the second type switching circuit from the second state, for example, OFF-state to the first state, for example, ON-state and also to cause the subthreshold current reduction control circuit 20 to keep the switching circuit SP as the first type switching circuit in the first state, for example, ON-state. The fuse circuit 30 may be configured to be cut to switch the switching circuit DN as the second type switching circuit from the second state, for example, OFF-state to the first state, for example, ON-state and also to cause the subthreshold current reduction control circuit 20 to keep the switching circuit SN as the first type switching circuit in the first state, for example, ON-state. The conditions for causing the fuse circuit 30 to be cut may be given optionally in consideration of the application of the semiconductor device to a particular device such as a semiconductor memory.

When the semiconductor device 1 is used for the semiconductor memory including plural memory banks, typically the control circuit 100 may include, but is not limited to, a fuse circuit 30, a subthreshold current reduction control circuit 20, and a selecting circuit 10. The selecting circuit 10 may be configured to supply a bank select signal BANKSEL to the subthreshold current reduction control circuit 20. The bank select signal BANKSEL is a signal to select a memory bank in the semiconductor memory such as DRAMs. The selecting circuit 10 may be coupled through the subthreshold current reduction control circuit 20 to the switching circuits SP and SN as the first type switching circuits. The fuse circuit 30 may be coupled through the subthreshold current reduction control circuit 20 to the switching circuits SP and SN as the first type switching circuits. The fuse circuit 30 may be coupled to the switching circuits DB and DN as the second type switching circuits. The fuse circuit 30 may be configured to be cut to switch the switching circuit DB as the second type switching circuit from the second state, for example, OFF-state to the first state, for example, ON-state and also to cause the subthreshold current reduction control circuit 20 to keep the switching circuit SP as the first type switching circuit in the first state, for example, ON-state. The fuse circuit 30 may be configured to be cut to switch the switching circuit DN as the second type switching circuit from the second state, for example, OFF-state to the first state, for example, ON-state and also to cause the subthreshold current reduction control circuit 20 to keep the switching circuit SN as the first type switching circuit in the first state, for example, ON-state. The conditions for causing the fuse circuit 30 to be cut may be given optionally in consideration of the application of the semiconductor device to a particular device such as a semiconductor memory.

In more details, when the switching circuits SN and DN include N-channel MOS transistors and the switching circuits SP and DB include P-channel MOS transistors, the control circuit 100 may further include first and second inverters 41 and 42. The subthreshold current reduction control circuit 20 may be connected through to the first inverter 41 to the switching circuit SP. The fuse circuit 30 may be connected through to the second inverter 42 to the switching circuit DB.

When the memory bank is in an active state, the logic circuit 50 can be placed in the active state by the output signal from the SCRC control circuit 20 that switches the switching circuits SP and SN to ON-states, thereby connecting the main power lines VDD and VSS to the sub power lines VDT and VST. When the memory bank is in an idle state, the switching circuits SP and SN can be placed in the OFF-states, thereby reducing the current leakage from the MOS transistor that is included in the logic circuit 50.

Figure 2:
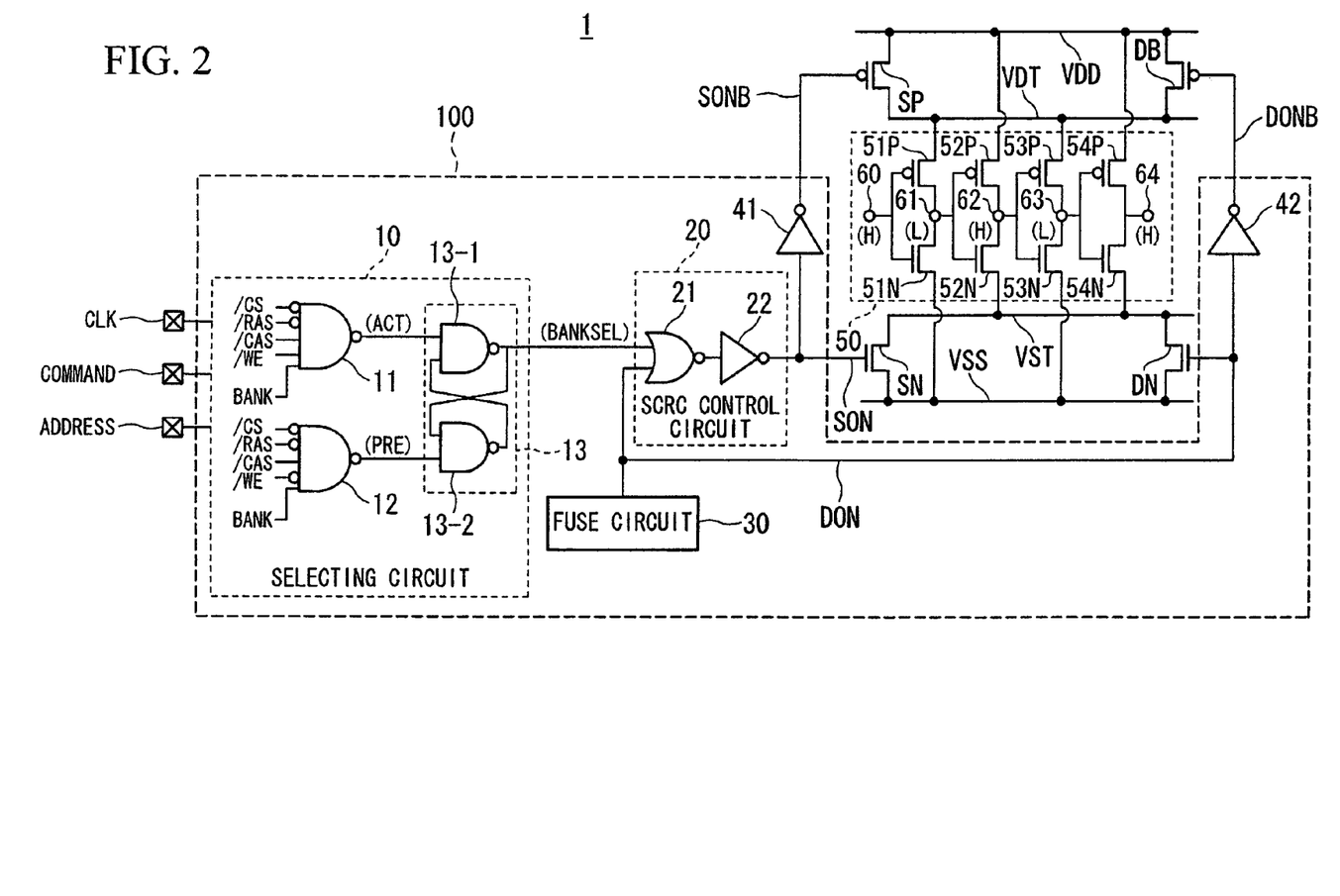
FIG. 2 is a circuit diagram illustrating the circuit configuration of the semiconductor device of FIG. 1.

FIG. 2 is a circuit diagram illustrating the circuit configuration of the semiconductor device of FIG. 1. The semiconductor device 1 may include one or more memory banks which are not illustrated. The logic circuit 50 may also be applied to a sense amplifier circuit that can be used to amplify data that have been read of memory cells in the memory bank.

The main power line VDD supplies a power voltage. When the memory bank is in the active state, the sub power line VDT supplies the same voltage as the power voltage of the main power line VDD. When the memory bank is in the idle state, the sub power line VDT supplies the voltage lower than the power voltage. The main power line VSS is grounded. When the memory bank is in the active state, the sub power line VST supplies the same voltage as the ground voltage of the main power line VSS. When the memory bank is in the idle state, the sub power line VST supplies the voltage higher than the ground voltage.

The switching circuits SP and DB may include, but are not limited to, PMOS transistors. The switching circuits SP and DB have sources that are connected to the main power line VDD. The switching circuits SP and DB have drains that are connected to the sub power line VDT. The switching circuits SN and DN may include, but are not limited to, NMOS transistors. The switching circuits SN and DN have sources that are connected to the main power line VSS. The switching circuits SN and DN have drains that are connected to the sub power line VST. The switching circuit SP has a gate that is connected to the output of the SCRC control circuit 20 through the inverter 41. The switching circuit SN has a gate that is connected to the output of the SCRC control circuit 20 directly. The switching circuit DB has a gate that is connected to the output of the fuse circuit 30 through the inverter 42. The switching circuit DN has a gate that is connected to the output of the fuse circuit 30.

The logic circuit 50 is connected to the main power lines VDD and VSS, and the sub power lines VDT and VST. The voltage supplied to the logic circuit 50 is controlled by the switching circuits SP, SN, DB, and DN. The logic circuit 50 may include, but is not limited to, first, second, third, and fourth inverters. The first inverter may include, but is not limited to, a PMOS transistor 51P and an NMOS transistor 51N. The second inverter may include, but is not limited to, a PMOS transistor 52P and an NMOS transistor 52N. The third inverter may include, but is not limited to, a PMOS transistor 53P and an NMOS transistor 53N. The fourth inverter may include, but is not limited to, a PMOS transistor 54P and an NMOS transistor 54N. The logic circuit 50 may have an input terminal 60, terminals 61, 62, and 63, and an output terminal 64.

The PMOS transistors 51P and 53P have sources that are connected to the sub power line VDT. The PMOS transistors 51P and 53P have drains that are respectively connected to drains of the corresponding NMOS transistors 51N and 53N. The NMOS transistors 51N and 53N have sources that are connected to the main power line VSS. The PMOS transistors 52P and 54P have sources that are connected to the main power line VDD. The PMOS transistors 52P and 54P have drains that are respectively connected to drains of the corresponding NMOS transistors 52N and 54N. The NMOS transistors 52N and 54N have sources that are connected to the sub power line VST.

The input terminal 60 is connected to the gates of the PMOS transistor 51P and the NMOS transistor 51N. The terminal 61 is connected to the drains of the PMOS transistor 51P and the NMOS transistor 51N and the gates of the PMOS transistor 52P and the NMOS transistor 52N. The terminal 62 is connected to the drains of the PMOS transistor 52P and the NMOS transistor 52N and the gates of the PMOS transistor 53P and the NMOS transistor 53N. The terminal 63 is connected to the drains of the PMOS transistor 53P and the NMOS transistor 53N and the gates of the PMOS transistor 54P and the NMOS transistor 54N. The output terminal 64 is connected to the drains of the PMOS transistor 54P and the NMOS transistor 54N.

When the memory bank is in the idle state, the input terminal 60 receives a high level signal H, the terminal 61 supplies a low level signal L, the terminal 62 supplies the high level signal H, the terminal 63 supplies the low level signal L, and the output terminal 64 supplies the high level signal H.

The selecting circuit 10 controls operations of the semiconductor device 1. The selecting circuit 10 may include, but is not limited to, a command decoder which is not illustrated. The command decoder decodes a command signal that has been entered from the outside. The selecting circuit 10 is connected to external terminals such as a clock terminal CLK, a command terminal COMMAND, and an address terminal ADDRESS. The selecting circuit 10 receives a clock signal from the clock terminal CLK, wherein the clock signal has been supplied from a peripheral circuit that is provided outside the semiconductor device 1. The selecting circuit 10 also receives a command signal from the command terminal COMMAND, wherein the command signal has been supplied from the peripheral circuit. The selecting circuit 10 also receives an address signal from the address terminal ADDRESS, wherein the address signal has been supplied from the peripheral circuit.

The selecting circuit 10 illustrated in FIG. 2 is a portion of the selecting circuit 10. The portion of the selecting circuit 10 illustrated in FIG. 2 will be described. The selecting circuit 10 receives a chip selecting signal /CS, a row address strobe signal /RAS, a column address strobe signal /CAS, a word enable signal /WE, and a bank signal BANK. The chip selecting signal /CS, the row address strobe signal /RAS, the column address strobe signal /CAS, and the word enable signal /WE are the command signals. The bank signal BANK is generated in the inside of the selecting circuit 10. The selecting circuit 10 supplies a bank select signal BANKSEL based on the received signals. The bank select signal BANK-SEL selects a memory bank and places the selected memory bank in the active state. The bank select signal BANKSEL is supplied to the SCRC control circuit 20, and the current leakage in the logic circuit 50 is reduced based on the state of the memory bank, while the bank select signal BANKSEL was used only for controlling the memory bank in the conventional art. A plurality of the command terminals are disposed corresponding to the chip selecting signal /CS, the row address strobe signal /RAS, the column address strobe signal /CAS, and the word enable signal /WE. "/" of the name of the signal means that the signal of low level causes the active state of the memory bank.

The selecting circuit 10 may include, but is not limited to, NAND circuits 11 and 12 and a latch 13. The NAND circuit 11 receives signals of inverted logic of the chip selecting signal /CS and the row address strobe signal /RAS. The NAND circuit 11 receives the column address strobe signal /CAS, the word enable signal /WE, and the bank signal BANK. When the NAND circuit 11 receives an ACT command from the command terminal COMMAND, the NAND circuit 11 supplies the low level signal L. The ACT command is such that the chip selecting signal /CS is in low level, the row address strobe signal /RAS is in low level, the column address strobe signal /CAS is in high level, the word enable signal /WE is in high level, and the bank signal BANK is in high level. When the NAND circuit 11 receives a command other than the ACT command such as a PRE command, the NAND circuit 11 supplies the high level signal H.

The NAND circuit 12 receives signals of inverted logic of the chip selecting signal /CS, the row address strobe signal /RAS, and the word enable signal /WE. The NAND circuit 12 receives the column address strobe signal /CAS and the bank signal BANK. When the NAND circuit 12 receives the PRE command, the NAND circuit 12 supplies the low level signal L. The PRE command is such that the chip selecting signal /CS is in low level, the row address strobe signal /RAS is in low level, the column address strobe signal /CAS is in high level, the word enable signal /WE is in low level, and the bank signal BANK is in high level. When the NAND circuit 12 receives a command other than the PRE command such as the ACT command, the NAND circuit 12 supplies the high level signal H.

The latch 13 may include, but is not limited to, NAND circuits 13-1 and 13-2. The NAND circuit 13-1 receives signals supplied by the NAND circuits 11 and 13-2. The NAND circuit 13-2 receives signals supplied by the NAND circuits 12 and 13-1. The NAND circuit 13-1 supplies the bank select signal BANKSEL. In the active state after the latch 13 receives the ACT command and before the latch 13 receives the next PRE command, the latch 13 supplies the bank select signal BANKSEL in high level. In the idle state after the latch 13 receives the PRE command and before the latch 13 receives the next ACT command, the latch 13 supplies the bank select signal BANKSEL in low level. That is, the latch 13 supplies the bank select signal BANKSEL in the state of the received command.

The fuse circuit 30 may include, but is not limited to, a laser fuse. The fuse circuit 30 may be coupled to the SCRC control circuit and the switching circuits DB and DN. When the laser fuse is not disconnected, the fuse circuit 30 supplies the low level signal L. When the laser fuse is disconnected, the fuse circuit 30 supplies the high level signal H.

The SCRC control circuit may include, but is not limited to, an NOR circuit 21 and an inverter 22. The SCRC control circuit may be coupled between the fuse circuit 30 and the switching circuits SP and SN. When the laser fuse is not disconnected and the bank select signal BANKSEL is in high level, the fuse circuit 30 supplies the low level signal L and the inverter 22 supplies the high level signal H. When the laser fuse is not disconnected and the bank select signal BANK-SEL is in low level, the fuse circuit 30 supplies the low level signal L and the inverter 22 supplies the low level signal L. When the laser fuse is disconnected, the fuse circuit 30 supplies the high level signal H and the inverter 22 supplies the high level signal H that is not based on the state of the bank select signal BANKSEL.

The line SON connects the output of the inverter 22 with the gate of the switching circuit SN. The line SONB connects the output of the inverter 41 with the gate of the switching circuit SP. The line DON connects the output of the fuse circuit 30 with the gate of the switching circuit DN. The line DONB connects the output of the inverter 42 with the gate of the switching circuit DB.

The operation of the semiconductor device 1 of FIG. 2 that is applied with the SCRC as a current leakage reducing scheme will be described. When the SCRC is applied to the semiconductor device 1, the laser fuse of the fuse circuit 30 is not disconnected and the fuse circuit 30 supplies the low level signal L. When the PRE command is supplied and causing the idle state of the memory bank, the bank select signal BANK-SEL turns into low level. Then the gate of the switching circuit SP receives the high level signal H, the gate of the switching circuit SN receives the low level signal L, and the switching circuits SP and SN are in OFF-state. The switching circuits DB and DN are in OFF-state at any time, for the states of the switching circuits DB and DN depend not on the output of the SCRC control circuit 20 but on the output of the fuse circuit 30.

Then the input terminal 60 receives the high level signal H as described above. Current leakage can be generated in the PMOS transistors 51P and 53P, for the gates of the PMOS transistors 51P and 53P receive the low level signal L and the PMOS transistors 51P and 53P are in OFF-state. But the current leakage is reduced, for the sources of the PMOS transistors 51P and 53P are connected to the sub power line VDT and potential differences between the source and the gate of the PMOS transistors 51P and 53P are lowered.

Current leakage can be generated in the NMOS transistors 52N and 54N, for the gates of the NMOS transistors 52N and 54N receive the low level signal L and the NMOS transistors 52N and 54N are in OFF-state. But the current leakage is reduced, for the sources of the NMOS transistors 52N and 54N are connected to the sub power line VST and potential differences between the source and the gate of the NMOS transistors 52N and 54N are lowered.

When the ACT command is supplied and causing the active state of the memory bank, the bank select signal BANKSEL is in high level. Then the switching circuits SP and SN are in ON-state, the main power line VDD is connected to the sub power line VDT, the main power line VSS is connected to the sub power line VST, and the logic circuit 50 will start its operation.

When the current leakage is under the specified current value that is the SPEC current value, the SCRC needs not be used. Then the laser fuse of the fuse circuit 30 is disconnected, and the switching circuits DB and DN and the switching circuits SP and SN are in ON-state at any time.

Figure 3:
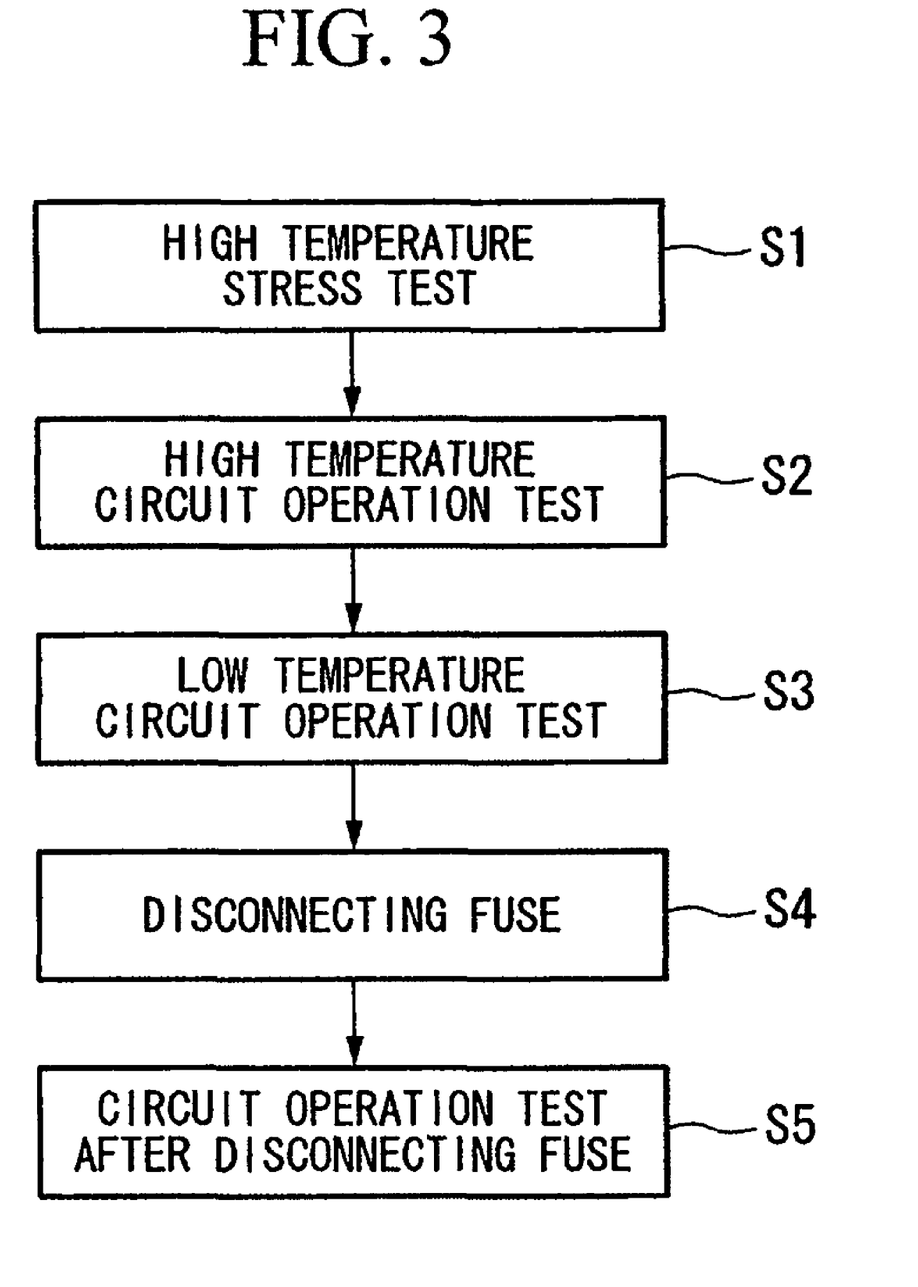
FIG. 3 is a flow chart showing a prove test of the semiconductor device of FIG. 1.

Whether to use the SCRC or not depends on variations of devices in a fabricating process. FIG. 3 is a flow chart showing a prove test of the semiconductor device 1. Whether to disconnect the laser fuse of the fuse circuit 30 or not is determined by the result of the probe test of FIG. 3. The prove test is performed by a sequence of a high temperature stress test S1, a high temperature circuit operation test S2, a low temperature circuit operation test S3, disconnecting fuse S4, and a circuit operation test after disconnecting fuse S5. Whether to disconnect the laser fuse of the fuse circuit 30 or not is determined by the result of the high temperature stress test S1, the high temperature circuit operation test S2, and the low temperature circuit operation test S3.

In the test process of the high temperature stress test S1, the high temperature circuit operation test S2, and the low temperature circuit operation test S3, current leakage in the MOS transistor of the logic circuit 50 is measured in a test mode that makes the switching circuits SP and SN ON-state. When the measured current leakage is under the specified current value, the laser fuse of the fuse circuit 30 is disconnected in the process of disconnecting fuse S4.

In the conventional art, when the laser fuse of the fuse circuit 30 is disconnected, the SCRC control circuit supplies the high level signal H at any time as described above. Then the switching circuits SP and SN turn into ON-state at any time, and the main power lines VDD and VSS are respectively connected to the sub power lines VDT and VST. Then the electrical impedance of power supply will increase by resistance of the switching circuits SP and SN that are in ON-state as compared with the case not using the SCRC.

In the first embodiment of the present invention, when the laser fuse of the fuse circuit 30 is disconnected, the control circuit 100 keeps the switching circuits SP and SN in ON-state. When the laser fuse of the fuse circuit 30 is disconnected, the control circuit 100 switches the switching circuits DB and DN from OFF-state to ON-state. The switching circuit DB is disposed between the main power line VDD and the sub power line VDT in parallel with the switching circuit SP. The switching circuit DN is disposed between the main power line VSS and the sub power line VST in parallel with the switching circuit SN. The electrical impedance between the main power line VDD and the sub power line VDT is produced by ON-resistances of the switching circuit SP and the switching circuit DB. The electrical impedance between the main power line VSS and the sub power line VST is produced by ON-resistances of the switching circuit SN and the switching circuit DN. The electrical impedance is equal to or lower than a threshold value. When the switching circuits DB and DN are ON-state, the electrical impedances between terminals of the switching circuits SP and SN are reduced. That is, the electrical impedance between the main power line VDD and the sub power line VDT is reduced, and the electrical impedance between the main power line VSS and the sub power line VST is reduced.

FIG. 2 illustrates the case when the number of the switching circuit DB disposed between the main power line VDD and the sub power line VDT is one and the number of the switching circuit DN disposed between the main power line VSS and the sub power line VST is one. But the number of the switching circuit DB or the number of the switching circuit DN is not limited to one. A plurality of the switching circuits DB or DN may be disposed between the main power line and the sub power line so that electrical impedance between the main power line and the sub power line is within limit of the impedance decided beforehand. The fuse circuit 30 is coupled to the plurality of the switching circuits DB and DN. The fuse circuit 30 switches the plurality of the switching circuits DB and DN from the OFF-state to ON-state. By disposing the plurality of the switching circuits DB and DN between the main power lines VDD and VSS and the sub power lines VDT and VST, the impedances between the main power lines VDD and VSS and the sub power lines VDT and VST can be made within the limit of the impedance without using the SCRC.

The number of the laser fuses disposed in the fuse circuit 30 may be one, for the laser fuse can be shared by the switching circuits SP, SN, DB and DN. When the number of the laser fuses is one, all of the switching circuits SP, SN, DB and DN are in ON-state by disconnecting the one laser fuse.

When the plurality of the switching circuits DB and DN are disposed, it is necessary to adjust the number of the switching circuits that are in ON-state. The number of the laser fuses disposed in the fuse circuit 30 is the same as the number of the switching circuits to be in ON-state. By disconnecting the laser fuses, the impedance between the main power lines VDD and VSS and the sub power lines VDT and VST can be adjusted.

The switching circuits SP and SN need to be in ON-state before the logic circuit start its operation. It is free when the switching circuits DB and DN turn into ON-state unlike the switching circuits SP and SN. So the switching circuits DB and DN can be disposed freely in the fabricating process.

In general, the switching circuits SP and SN are prepared as a unit cell by combining the PMOS transistor and the NMOS transistor which gate widths are decided beforehand on a layout. The required number of the switching circuits SP and SN is set up by the multiple of the unit cell. The number of the PMOS transistor is seldom the same as the number of the NMOS transistor. In many cases, either of the PMOS transistor or the NMOS transistor is not used. That is, either of the line SON or the line SONB is not connected to the PMOS transistor or the NMOS transistor. By connecting the unused PMOS transistor or the unused NMOS transistor with the line DON or the line DONB, the unused PMOS transistor or the unused NMOS transistor becomes the switching circuits DB or DN. The switching circuits DB and DN are the dummy cells. Increase of layout area by the dummy cell is not simply proportional to the gate width of the dummy cell. Increase of layout area by the dummy cell can be suppressed to some extent.

In the first preferred embodiment, the probe test that judges whether the current leakage is within in the specified current value defined beforehand or not is held to each chip of the fabricated device. When the current leakage is within in the specified current value and threshold voltage of the MOS transistor is rather high, the laser fuse of the fuse circuit 30 is disconnected, the SCRC control circuit 20 is in the idle state, the switching circuits DB and DN that are disposed independent from the SCRC control circuit are in on-state at any time, and the impedance between the main power line and the sub power line will be reduced. As a result, it becomes possible to reduce the impedance without enlarging the gate width of the switching circuits SP and SN that are used in the SCRC.

The above mentioned embodiment is the case that applies the present invention to the configuration of the SCRC as the current leakage reducing scheme. The present invention can be applied to the configuration of the current leakage reducing scheme besides the SCRC such that a power line is subdivided in every blocks and a power supply of a block in the idle state is stopped.

It is apparent that the present invention is not limited to the above embodiments, but may be modified and changed without departing from the scope and spirit of the invention.

What is claimed is:

1. A semiconductor device comprising:
    a first switching circuit that switches between first and second states;
    a second switching circuit that switches between the first and second states, the second switching circuit reducing a first power impedance across the first switching circuit; and
    a control circuit coupled to the first and second switching circuits, the control circuit keeping the first switching circuit in the first state, the control circuit switching the second switching circuit from the second state to the first state, and the control circuit comprising a non-volatile circuit that is coupled to the second switching circuit, the non-volatile circuit being configured to be cut to switch the second switching circuit from the second state to the first state.

2. The semiconductor device according to claim 1, further comprising:
    a logic circuit that is coupled to the first switching circuit,
    wherein the first switching circuit switches between the first and second states to switch power voltages to be supplied to the logic circuit.

3. The semiconductor device according to claim 1, wherein the first and second switching circuits are coupled in parallel to the control circuit.

4. The semiconductor device according to claim 1, wherein the first state of the first and second switching circuits is ON-state, and the second state of the first and second switching circuits is OFF-state.

5. The semiconductor device according to claim 1, wherein the non-volatile circuit is configured to be cut to keep the first switching circuit in the first state and to switch the second switching circuit from the second state to the first state.

6. The semiconductor device according to claim 2, further comprising:
    a main power line that supplies a first voltage; and
    a sub power line that supplies a second voltage different from the first voltage, the sub power line being coupled to the logic circuit,
    wherein each of the first and second switching circuits is coupled between the main power line and the sub power line.

7. The semiconductor device according to claim 6, wherein the control circuit further comprises:
    a subthreshold current reduction control circuit coupled between the non-volatile circuit and the first switching circuit,
    wherein once the non-volatile circuit is cut, the subthreshold current reduction control circuit keeps the first switching circuit in the first state.

8. The semiconductor device according to claim 6, wherein the second switching circuit comprises a plurality of switching transistor circuits, each of which is coupled between the main power line and the sub power line, each of the switching transistor circuits switches between the first state and the second state,
    the non-volatile circuit is coupled to the plurality of switching transistor circuits, and
    the non-volatile circuit is cut to switch the plurality of switching transistor circuits from the second state to the first state.

9. The semiconductor device according to claim 8, wherein ON-resistances of the first switching circuit and the switching transistor circuits produce a second power impedance that is equal to or lower than a threshold value.

10. The semiconductor device according to claim 7, wherein when there is satisfied a condition for non-use of the subthreshold current reduction control circuit, the non-volatile circuit is cut to keep the first switching circuit in the first state and to switch the second switching circuit from the second state to the first state.

11. The semiconductor device according to claim 10, wherein the condition is related to a leakage of current of transistors included in the logic circuit.

12. A semiconductor device comprising:
    a main power line that supplies a first voltage;
    a sub power line that supplies a second voltage different from the first voltage;
    a logic circuit coupled to the sub power line;
    a first switching circuit being coupled between the main power line and the sub power line, the first switching circuit switching between first and second states to switch the first and second voltages to be supplied to the logic circuit;
    a second switching circuit being coupled between the main power line and the sub power line, the second switching circuit switching between the first and second states, the second switching circuit reducing a power impedance between the main power line and the sub power line; and
    a control circuit coupled to the first and second switching circuits, the control circuit keeping the first switching circuit in the first state, the control circuit switching the second switching circuit from the second state to the first state, and the control circuit comprising a non-volatile circuit that is coupled to the second switching circuit, the non-volatile circuit being configured to be cut to switch the second switching circuit from the second state to the first state.

13. The semiconductor device according to claim 12, wherein the first and second switching circuits are coupled in parallel to the control circuit.

14. The semiconductor device according to claim 12, wherein the first state of the first and second switching circuits is ON-state, and the second state of the first and second switching circuits is OFF-state.

15. The semiconductor device according to claim 12, wherein the non-volatile circuit is configured to be cut to keep the first switching circuit in the first state and to switch the second switching circuit from the second state to the first state.

16. The semiconductor device according to claim 12, wherein the control circuit further comprises:
   a subthreshold current reduction control circuit coupled between the non-volatile circuit and the first switching circuit,
   wherein once the non-volatile circuit is cut, the subthreshold current reduction control circuit keeps the first switching circuit in the first state.

17. The semiconductor device according to claim 12, wherein the second switching circuit comprises a plurality of switching transistor circuits, each of which is coupled between the main power line and the sub power line, each of the switching transistor circuits switches between the first state and the second state,
   the non-volatile circuit is coupled to the plurality of switching transistor circuits,
   the non-volatile circuit is cut to switch the plurality of switching transistor circuits from the second state to the first state, and
   the power impedance between the main power line and the sub power line is produced by ON-resistances of the first switching circuit and the switching transistor circuits, and the power impedance is equal to or lower than a threshold value.

18. The semiconductor device according to claim 12, wherein when there is satisfied a condition for non-use of the subthreshold current reduction control circuit, the non-volatile circuit is cut to keep the first switching circuit in the first state and to switch the second switching circuit from the second state to the first state.

19. The semiconductor device according to claim 18, wherein the condition is related to a leakage of current of transistors included in the logic circuit.

20. The semiconductor device according to claim 1, wherein the control circuit further comprises:
   a first inverter, the non-volatile circuit being coupled to the second switching circuit via the first inverter;
   a second inverter coupled to the first switching circuit; and
   a subthreshold current reduction control circuit coupled between the second inverter and the non-volatile circuit.

21. A semiconductor device comprising:
   a first power supply line that supplies a first voltage;
   a second power supply line that supplies a second voltage; and
   a circuit coupled between the first and second power supply lines, the circuit electrically coupling the first power supply line with the second power supply line in a first impedance at a first state in a first mode, electrically decoupling the first power supply line with the second power supply line in a second impedance higher than the first impedance at a second state in the first mode, and electrically coupling the first power supply line with the second power supply line in a third impedance lower than the first impedance in a second mode.

22. The semiconductor device according claim 21, wherein the circuit includes a first switching circuit coupled between the first and second power supply lines, the first switching circuit electrically coupling the first power supply line with the second power supply line in the first impedance at the first state of the first mode and in the second mode, electrically decoupling the first power supply line with the second power supply line in the second impedance at the second state in the first mode, and a second switching circuit coupled between the first and second power supply lines, the second switching circuit electrically coupling the first power supply line with the second power supply line in the second mode.

23. The semiconductor device according to claim 21, wherein the first state comprises an active state, the second state comprises an idling state, the first mode comprises a mode which is reducing a current consumption and the second mode comprises a mode which is not reducing a current consumption.

24. The semiconductor device according to claim 1, wherein the first switching circuit includes a subthreshold current reduction circuit.

25. The semiconductor device according to claim 12, wherein the first switching circuit includes a subthreshold current reduction circuit.

26. The semiconductor device according to claim 21, wherein the circuit includes a subthreshold current reduction circuit.

27. A semiconductor device comprising:
   a subthreshold current reduction circuit including a first switch circuit that switches between first and second states;
   a second switching circuit that switching that switches between the first and second states, the second switching circuit reducing a first power impedance across the first switching circuit; and
   a control circuit coupled to the first and second switching circuits, the control circuit keeping the first switching circuit in the first state, the control circuit switching the second switching circuit from the second state to the first state, and the control circuit comprising a non-volatile circuit that is coupled to the second switching circuit, the non-volatile circuit being configured to be programmed to switch the second switching circuit from the second state to the first state.

28. The semiconductor device according to claim 27, further comprising:
   a logic circuit that is coupled to the first switching circuit,
   wherein the first switching circuit switches between the first and second states to switch power voltages to be supplied to the logic circuit.

29. The semiconductor device according to claim 27, wherein the first and second switching circuits are coupled to in parallel to the control circuit 30. The semiconductor device according to claim 27, wherein the first state of the first and second switching circuits is a high impedance state, and the second state of the first and second switching circuits is a low impedance state.

31. The semiconductor device according to claim 27, wherein the non-volatile circuit includes a fuse circuit.

32. The semiconductor device according to claim 27, further comprising:
   a main power line that supplies a first voltage, and
   a sub power line that supplies a second voltage,
   wherein each of the first and second switching circuits is coupled between the main power line and the sub power line.

33. A method comprising:
   testing a semiconductor device including a subthreshold current reduction circuit coupled between a power supply line and a logic circuit to reduce a subthreshold current leakage and a control circuit to control the subthreshold current reduction circuit to connect the power supply line with the logic circuit in a low impedance or a high impedance;
   measuring a subthreshold current of a semiconductor device under the subthreshold current reduction circuit being in the low impedance by the control circuit; and programming a control circuit to control the subthreshold current reduction circuit to connect the power supply line with the logic circuit in the low impedance when the subthreshold current is lower than a predetermined value.

34. The method according to claim 33, wherein the programming a control circuit includes programming a nonvolatile memory of the control circuit.

35. A method comprising:
testing a semiconductor device including a first transistor to reduce a subthreshold current leakage, a second transistor in parallel with the first transistor, and a control circuit to control the first and second transistors;
measuring a subthreshold current of a semiconductor device under the first transistor being in a low impedance by the control circuit; and
programming a control circuit so as to render the second transistor a low impedance state when the subthreshold current is lower than a predetermined value.

36. The method according to claim 35, wherein the programming of the control circuit includes programming a non-volatile memory of the control circuit so as to render the first transistor a low impedance state when the subthreshold current is lower than the predetermined value.

37. The method according to claim 35, wherein the programming of the control circuit includes programming a non-volatile memory of the control circuit.

38. The semiconductor device according to claim 1, wherein the non-volatile circuit comprises a fuse circuit.

39. The semiconductor device according to claim 12, wherein the non-volatile circuit comprises a fuse circuit.

* * * * *